United States Patent
Weiss

(10) Patent No.: US 7,569,916 B2
(45) Date of Patent: Aug. 4, 2009

(54) SEPARABLE NETWORK INTERCONNECT SYSTEMS AND ASSEMBLIES

(75) Inventor: Roger E. Weiss, Foxboro, MA (US)

(73) Assignee: Paricon Technologies Corp., Fall River, MA (US)

( * ) Notice: Subject to any disclaimer, the term of this patent is extended or adjusted under 35 U.S.C. 154(b) by 215 days.

(21) Appl. No.: 11/717,842

(22) Filed: Mar. 14, 2007

(65) Prior Publication Data

US 2007/0216014 A1   Sep. 20, 2007

Related U.S. Application Data

(60) Provisional application No. 60/782,045, filed on Mar. 14, 2006.

(51) Int. Cl.
*H01L 29/40* (2006.01)

(52) U.S. Cl. .................. 257/664; 257/691; 257/777; 343/702; 343/873

(58) Field of Classification Search .............. 257/691, 257/777, 786, 664; 343/702, 873, 909
See application file for complete search history.

(56) References Cited

U.S. PATENT DOCUMENTS

| | | | |
|---|---|---|---|
| 6,447,308 B1 | 9/2002 | McCarthy et al. | |
| 6,497,583 B1 | 12/2002 | Weiss et al. | |
| 6,649,115 B2 | 11/2003 | Weiss et al. | |
| 6,702,587 B2 | 3/2004 | Weiss et al. | |
| 6,835,072 B2 | 12/2004 | Simons et al. | |
| 6,854,985 B1 | 2/2005 | Weiss | |
| 6,854,986 B2 | 2/2005 | Weiss | |
| 6,929,484 B2 | 8/2005 | Weiss et al. | |
| 7,366,101 B1 * | 4/2008 | Varier et al. ............. | 370/241 |
| 7,405,698 B2 * | 7/2008 | de Rochemont ...... | 343/700 MS |
| 2003/0032310 A1 | 2/2003 | Weiss et al. | |
| 2003/0166355 A1 | 9/2003 | Simons et al. | |
| 2003/0181071 A1 | 9/2003 | Weiss et al. | |
| 2003/0222282 A1 | 12/2003 | Fjelstad et al. | |
| 2003/0224633 A1 | 12/2003 | Weiss et al. | |
| 2004/0219807 A1 | 11/2004 | Weiss et al. | |
| 2004/0251572 A1 | 12/2004 | Weiss et al. | |
| 2006/0091507 A1 | 5/2006 | Fjelstad et al. | |
| 2007/0046393 A1 * | 3/2007 | Quan et al. .................. | 333/128 |

OTHER PUBLICATIONS

Mallik, et al., Intel Tech J, 2005, 9(4), 259-271.
Johnson, "High Speed Digital Design," Edition 2, Prentice Hall, 2001.
Corbin, et al., IBM J Res Dev. 2002, 46(6), 763-778.

* cited by examiner

*Primary Examiner*—Phuc T Dang
(74) *Attorney, Agent, or Firm*—William R. Lambert

(57) ABSTRACT

Microelectronic assemblies interconnected using a separable network interface and electronic systems using the microelectronic assemblies to physically separate high performance signals and lower performance signals to enhance system performance are disclosed.

19 Claims, 2 Drawing Sheets

SEPARABLE NETWORK INTERCONNECT SYSTEMS AND ASSEMBLIES

This application claims the benefit of U.S. Provisional Application No. 60/782,045 filed Mar. 14, 2006, which is incorporated by reference herein in its entirety.

FIELD

Disclosed herein are microelectronic assemblies electrically interconnected using a separable network interface. The microelectronic assemblies can be used in electronic systems to physically separate high performance signals and lower performance signals to enhance system performance.

BACKGROUND

Although significant advances in printed circuit board materials and design have enhanced the ability to meet the needs of high performance electronic systems, performance limitations become increasingly difficult to address at digital system speeds at multiple gigahertz (see, e.g., Mallik et al., *Intel Tech J,* 2005 9, 4, 259-271; and Johnson, "High Speed Digital Design," Prentice Hall, 2001). An approach to overcome performance limitations of printed circuit board architectures is to physically separate the high-speed signals from lower speed signals and power and ground connections. High-speed signal sources such as microprocessors can be interconnected with controlled impedance circuit elements that can be fabricated separately from the printed circuit board and high-speed devices can be independently interconnected through a high-speed transmission line that is independent of the lower speed signals.

Interconnection overlays for electrically connecting high-speed signals between integrated circuit packages and lower speed signals through traces or other conductive structures on a printed circuit board have been proposed (see, e.g., Fjelstad et al., U.S. Application Publication Nos. 2003/0222282 and 2006/0091507). High-speed signals can be routed from on integrated circuit package to another integrated circuit package via a high-speed structure such as a cable, which can be non-separably connected to the packages, or separably interconnected to the integrated circuit packages via an edge connector. Edge connector technology can compromise electrical performance, particularly in high performance systems.

While a high speed transmission line interconnecting high speed devices or modules incorporating high speed devices can be non-separably connected to create a complex overlay that must then be assembled to the substrate carrying lower speed signals, a high speed bus incorporating separable interconnects can afford several advantages. An independent high-speed network formed with separable interconnects can facilitate, for example, assembly, upgrade, field repair, maintenance, and testing. For example, individual high speed devices or modules can be separately tested, inserted into separable sockets incorporating a high speed transmission line, and independently removed and replaced as necessary. Separable high performance interconnection technologies such as certain anisotropically conductive elastomer (ACE) interconnection technologies enable separable interconnection of multiple GHz electronic signals. Furthermore, ACE interconnection technology is amenable to effecting high-performance interconnection to fine-pitch land-grid, or pad-grid array electronic devices.

Accordingly, in a first aspect, electronic interconnect assemblies are provided comprising a first microelectronic assembly, a network interface comprising a transmission line electrically interconnected to a platform, a separable interconnect electrically interconnecting the first microelectronic assembly to the platform and to the transmission line, and a second microelectronic assembly electrically interconnected to the network interface and to the first microelectronic assembly.

In a second aspect, electronic systems are provided comprising a first, a second, and a third microelectronic assembly, a network interface comprising a first platform, a second platform, and a transmission line, wherein the first and second platforms are electrically interconnected to the transmission line, a separable interconnect electrically interconnecting the first microelectronic assembly to the transmission line and to the first platform, and a separable interconnect electrically interconnecting the second microelectronic assembly to the transmission line and to the second platform, wherein the first platform and the second platform are electrically interconnected to the third microelectronic assembly.

These and other features of the present disclosure are set forth herein.

BRIEF DESCRIPTION OF THE DRAWINGS

The skilled artisan will understand that the drawings, described herein, are for illustration purposes only. The drawings are not intended to limit the scope of the present disclosure.

DETAILED DESCRIPTION

Using a network interface comprising a high-speed transmission line high performance signals can be physically separated from lower performance signals to improve the overall performance of an electronic system. For example, a network interface can be removed and replaced with a different network interface that permits interconnection to different electronic assemblies, devices, system boards, and the like. The separability of the electronic interconnect assemblies provided by the present disclosure can facilitate the ability to upgrade, repair, and assemble of microelectronic assemblies and systems characterized by high performance and lower performance signals. The ability to change the network interface can be used to enhance system performance, remove and/or add system features, and/or dynamically reduce or expand a system as appropriate.

Figure 1:
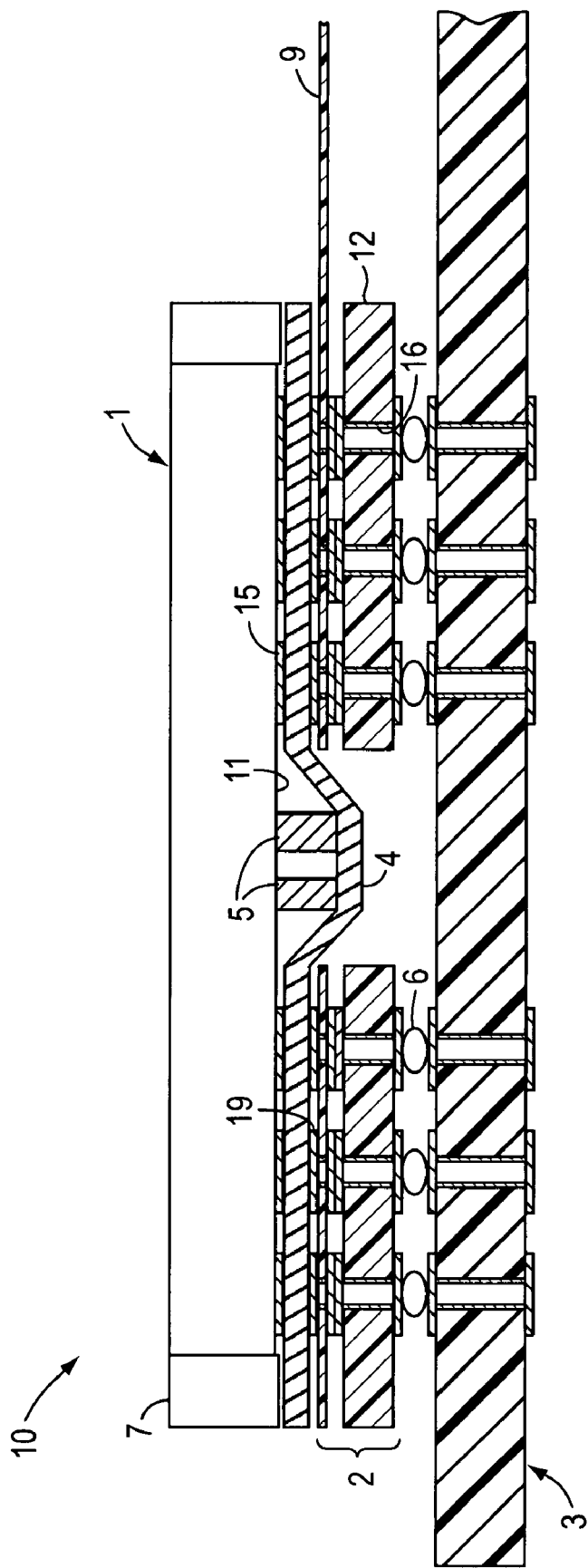
FIG. 1 illustrates an embodiment of an electronic interconnect assembly.
Figure 2:
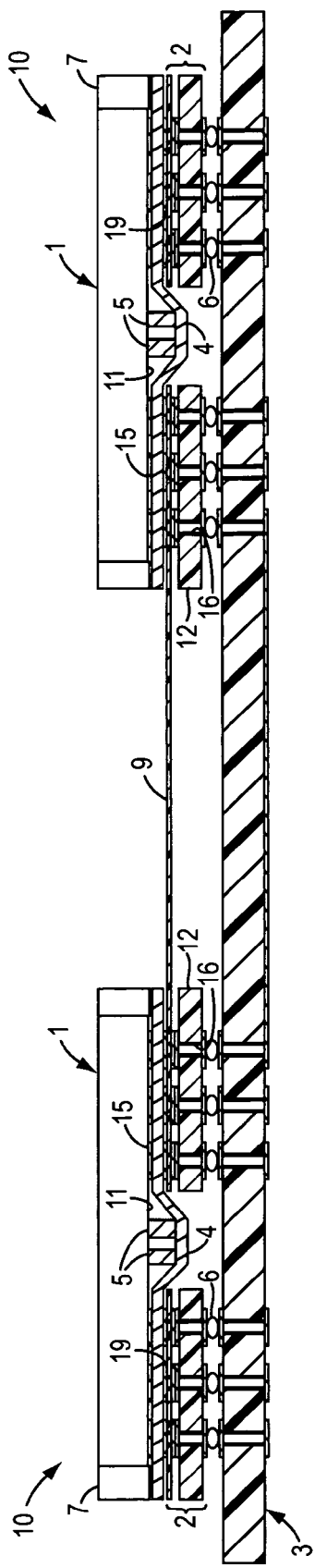
FIG. 2 illustrates an embodiment of an electronic system having a first, a second, and a third microelectronic assembly.

An embodiment of an interconnection assembly is illustrated in FIG. 1. The interconnection assembly 10 shown in FIG. 1 comprises a first microelectronic assembly 1, a network interface 2, and a second microelectronic assembly 3. First microelectronic assembly 1 includes microelectronic devices 5 mounted to the underside 11 of first microelectronic assembly 1 although first microelectronic assembly 1 may be any appropriate microelectronic device. First microelectronic assembly 1 further includes interconnection pads 15 on a first side 11 of first microelectronic assembly 1. Network interface 2 includes a platform 12 and a transmission line 9. Platform 12 can be a rigid substrate such as a printed circuit board material. Platform 12 can be of sufficient thickness to physically separate first microelectronic assembly 1 from second microelectronic module 3 and as shown in FIG. 1 can have one or more openings to provide clearance for devices 5 mounted on microelectronic assembly 1 or second microelectronic assembly 3. Devices can be mounted on either side of first microelectronic assembly 1 and/or second microelectronic assembly. Platform 12 can be configured to accommodate the devices. For example, platform 12 can have openings to provide space for the devices, and/or can be of sufficient thickness to provide clearance for devices mounted on either the first or second microelectronic assemblies. Platform 12 can be sufficiently rigid to provide a planar interconnection surface between first microelectronic assembly 1 and network interface 2. Transmission line 9 can be rigid or flexible and used to route electronic signals from electronic interconnect assembly 10. Platform 12 can include plated through holes 16 through which second microelectronic assembly 3 is electrically interconnected to transmission line 9 and/or to first microelectronic assembly 1. Other interconnection technologies such as vias, e.g., blind- or through-, can be used to provide electrical interconnection through platform 12, transmission line 9, and network interface 2.

As shown in FIG. 1, platform 12 and transmission line 9 are non-separably interconnected to form a rigid-flex structure. In certain embodiments, platform 12 and transmission line 9 can be integrated to form a laminated flex structure. Platform 12 and transmission line can also be separably interconnected using any appropriate separable interconnection technology, such as, for example, an ACE.

Second microelectronic assembly 3 can be a substrate such as a printed circuit board, which can be, for example, a motherboard of an electronic system. Network interface 2 is shown as being non-separably electrically interconnected to second microelectronic assembly 3 using solder balls 6, although other forms of conductive connections such as pins, points, wires, wire bonds, bumps, or any other appropriate integrated circuit interconnection technology can also be used. In certain embodiments, network interface 2 and microelectronic assembly 3 can be separably interconnected using, for example, compliant pins, ACEs, or any other appropriate separable interconnection technology.

First microelectronic assembly 1 and network interface 2 are electrically interconnected using a separable interconnect 4. Separable interconnect 4 can be any appropriate separable interconnection technology such as, but not limited to pins, surface mount contacts, and ACEs. In FIG. 1, first microelectronic assembly 1 is shown as being electrically interconnected to network interface 2 using an ACE 4. Separable interconnect 4 provides electrical interconnection between first microelectronic assembly 1 and transmission line 9, and between first microelectronic assembly 1 and second microelectronic assembly 3 through network interface 2. In certain embodiments, high performance signals to and from first microelectronic assembly 1 can be transmitted by transmission line 9, and lower performance signals to and from first microelectronic assembly 1 can be transmitted by second microelectronic assembly 3.

First microelectronic assembly 1 can include a socket 7 located, for example, around the perimeter of first electronic assembly 1. Socket 7 can include alignment features, such as pins, to facilitate alignment of electrical contact pads 15 of first microelectronic assembly 1 with electrical contact pads 19 of network interface 2 and/or second microelectronic assembly 3. Socket 7 can also include features for mounting separable interconnect 4. Socket 7 can also include features to facilitate alignment and coupling of first microelectronic assembly 1 to a mounting fixture (not shown).

In certain embodiments, a first electronic assembly comprises a high-speed device such as a microprocessor, ASIC, MUX, DMUX, PMD, transponder, memory, and the like, mounted on a interconnection substrate such as a printed circuit board or ceramic. Microelectronic devices can be mounted on either or both sides of a microelectronic assembly. A microelectronic assembly can also be an integrated module such as a multichip module or other integrated high performance component. High speed signals from the first microelectronic assembly can be transmitted to other high speed modules using an appropriately designed high performance network interface, and lower speed signals, including power and ground, can be transmitted through the second microelectronic assembly. A first microelectronic assembly can also include driver circuits to enhance the performance of the network interface for high-speed transmission.

High-speed transmission as used herein refers to signal transmission speeds that are intended to be segregated from lower speed signals. In certain embodiments, high-speed transmission refers to transmission speeds equal to or greater than about 1 GHz, in certain embodiments, equal to or greater than about 12 GHz, equal to or greater than about 25 GHz, and in certain embodiments, equal to or greater than about 40 GHz. High-speed transmission parameters can be determined by several methods and by various parameters known to those skilled in the art (see, e.g., Johnson, "High Speed Digital Design", Prentice Hall, 2001).

A network interface can include one or more transmission lines. Each of the one or more transmission lines can be rigid, flexible, or a combination thereof. An individual transmission line can interconnect one microelectronic assembly to one or more other microelectronic assemblies. A transmission line can be separably interconnected to a high performance microelectronic assembly using a land grid array interconnect such as that illustrated in FIG. 1 or using any other appropriate separable high speed interconnect. For transmitting high performance signals, the transmission line can be a controlled impedance transmission line.

The network interface can be designed to transmit high performance signals, lower performance signals, or a combination thereof. High performance signals refer to electronic signals characterized by a bandwidth of equal to or greater than about 1 GHz. Lower performance signals refer to electronic signals characterized by a bandwidth of less than about 1 GHz and can include power and ground. In certain embodiments of a microelectronic assembly, a network interface can transmit high performance signals and a second microelectronic assembly can transmit lower performance signals, thereby segregating the high performance and lower performance signals for enhanced system performance. In certain embodiments of an electronic interconnect assembly a network interface can transmit signals having the same performance characteristics as a second microelectronic assembly. In such embodiments, the network interface can be useful to relieve design complexity, to change the interconnect routing of the network interface, and/or to reduce cost.

In certain embodiments, a microelectronic interconnect assembly can include more than one network interface. Each of the more than one network interfaces can independently be designed to transmit high performance signals, lower performance signals, or combinations of high performance and lower performance signals. Each of the more than one network interfaces can independently be separably or non-separably interconnected to a platform. In certain embodiments, each of the more than one network interfaces can be separably interconnected to the platform. In certain embodiments, the multiple network interfaces can be stacked and electrically interconnected using any appropriate separable interconnection technology. The ability to incorporate additional network interfaces into a microelectronic interconnect assembly can facilitate modification, expansion, reconfiguration, upgrade, repair, and/or testing an electronic system.

A network interface can interconnect a microelectronic assembly to a single electronic unit, or in certain embodiments, to more than one electronic unit. An electronic unit can be for example, a microelectronic assembly provided by the present disclosure, a connector, a printed circuit board, and the like. When a network interface interconnects more than one microelectronic assembly provided by the present disclosure mounted on a system board, the network interface can be viewed as an overlay interconnection network. For interconnecting more than one microelectronic assembly, a network interface can include more than one transmission line interconnected to a platform.

A separable interconnection between a microelectronic assembly and a network interface can facilitate attachment and removal of a microelectronic assembly for purposes such as assembly, repair, and upgrade. The ability to remove and attach device modules can be particularly useful for upgrading microelectronic assemblies in the field.

Any appropriate separable interconnection technology can be used to interconnect a microelectronic assembly to a platform, or used for other separable interconnects disclosed herein. Separable interconnection technologies are known in the art and include, for example, compliant pins, and ACEs (see, e.g., Corbin et al., *IBM J Res Dev,* 2002, 46(6), 763-778). ACEs are a type of separable interconnection technology. Weiss et al. disclose ACEs comprising chains of conductive particles aligned perpendicular the plane of an elastomer sheet (see Weiss et al., U.S. Pat. Nos. 6,854,985, 6,854,986, 6,447,308, 6,649,115, and 6,497,583; and U.S. Application Publication No. 2003/0224633, each of which is incorporated by reference herein in its entirety). The ACEs disclosed by Weiss et al. are a composite of conductive metal elements in an elastomeric matrix that conducts through the thickness. This form of ACE comprises a large number of closely spaced columns of electrically conductive particles spanning the sheet thickness. When compressed between opposing conductors, such as pads, a separable, compliant high performance interconnect is formed. For thicknesses of about 0.002 inches to about 0.020 inches, ACEs disclosed by Weiss et al. are capable of forming high performance separable interconnects characterized by an inductance of less than 1 nH and a 3 dB fifth harmonic at greater than about 40 GHz. Thus, in certain embodiments where a high performance microelectronic assembly is to be interconnected to a high performance network interface, the ACEs disclosed by Weiss et al. can be advantageously employed. The choice of an appropriate separable interconnection technology used in an electronic interconnection or system provided by the present disclosure can depend on a number of factors including the high performance requirements of the system, power requirements, thermal requirements, and environmental requirements.

A compressive force can be applied to a separable interconnect material such as an ACE using a fixture. Examples of fixtures for applying a compressive force for interconnecting a separable interconnect material are disclosed, for example by Weiss et al., U.S. Pat. Nos. 6,929,484, 6,835,072, and 6,702,587; and U.S. Application Publication Nos. 2004/0251572, 2004/02119807, 2003/0181071, 2003/0166355, and 2003/0032310, each of which is incorporated by reference herein in its entirety.

A single interconnection technology or more than one interconnection technology can be used to separably interconnect a first microelectronic assembly to a network interface. For example, FIG. 1 shows an embodiment in which first microelectronic assembly 1 is interconnected to network interface 2 using a single interconnection technology, e.g., an ACE. In certain embodiments, it can be desirable to include more than one interconnection technology to meet requirements for interconnecting certain signals, power, and/or ground. An interconnection technology may be selected as appropriate for the electrical performance requirements of the signal to be interconnected and the electrical performance requirements of the system. For example, power and ground provided by second microelectronic assembly 3 can be interconnected to first microelectronic assembly 1 using conductive pins that extend through network interface 2, while other signals can be interconnected through a land grid array and ACE.

In certain embodiments, a system having one or more electronic interconnect assemblies provided by the present disclosure can provide high speed interconnectivity between a high speed microelectronic assembly and one or more other high speed microelectronic assemblies. The one or more high-speed microelectronic assemblies can be mounted to the same motherboard or a different motherboard as the first microelectronic assembly.

In certain embodiments, an electronic system comprising a high performance microelectronic assembly interconnected to a network interface can transmit signals at a bandwidth of equal to or greater than about 2 GHz, equal to or greater than about 12 GHz, equal to or greater than about 25 GHz, and in certain embodiments, equal to or greater than about 40 GHz. In certain embodiments, an electronic system comprising a high performance microelectronic assembly interconnected to a network interface can exhibit a 3 dB fifth harmonic at equal to or greater than about 2 GHz, equal to or greater than about 12 GHz, equal to or greater than about 25 GHz, and in certain embodiments, equal to or greater than about 40 GHz.

Finally, it should be noted that there are alternative ways of implementing the disclosures contained herein. Accordingly, the present embodiments are to be considered as illustrative and not restrictive, and the claims are not to be limited to the details given herein, but may be modified within the scope and equivalents thereof.

What is claimed is:

1. An electronic interconnect assembly comprising:
   a first microelectronic assembly;
   a network interface comprising a transmission line electrically interconnected to a platform;
   a separable interconnect electrically interconnecting the first microelectronic assembly to the platform and to the transmission line; and
   a second microelectronic assembly electrically interconnected to the network interface and to the first microelectronic assembly;
   wherein the separable interconnect comprises an anisotropically conductive elastomer.

2. The electronic interconnect assembly of claim 1, wherein high performance signals from the first microelectronic assembly are electrically interconnected to the transmission line and lower performance signals from the first microelectronic assembly are electrically interconnected to the second microelectronic assembly.

3. The electronic interconnect assembly of claim 1, wherein the network interface electrically interconnects the first microelectronic assembly to the second microelectronic assembly.

4. The electronic interconnect assembly of claim 1, wherein the anisotropically conductive elastomer comprises a plurality of electrically conductive elements embedded in an electrically non-conductive polymer, wherein each of the plurality of electrically conductive elements comprises a chain of electrically conductive particles.

5. The electronic interconnect assembly of claim 1, wherein electrical interconnections formed by the separable interconnect exhibit an inductance equal to or less than 1 nH.

6. The electronic interconnect assembly of claim 1, wherein electrical interconnections formed by the separable interconnect material exhibit a 3 dB fifth harmonic at greater than about 12 GHz.

7. The electronic interconnect assembly of claim 1,
wherein the transmission line comprises a high performance flex circuit and the platform comprises a printed circuit board.

8. The electronic interconnect assembly of claim 1, wherein the platform and the transmission line are integrated in the form of a laminated flex assembly.

9. The electronic interconnect assembly of claim 1,
wherein the platform and the transmission line are separably interconnected using an anisotropically conductive elastomer.

10. The electronic interconnect assembly of claim 1,
wherein the second microelectronic assembly is non-separably interconnected to the platform.

11. The electronic interconnect assembly of claim 1,
further comprising a mounting fixture for applying a compressive force to the separable interconnect.

12. An electronic system comprising:
a first, a second, and a third microelectronic assembly;
a network interface comprising a first platform, a second platform, and a transmission line, wherein the first and second platforms are electrically interconnected to the transmission line;
a separable interconnect electrically interconnecting the first microelectronic assembly to the transmission line and to the first platform; and
a separable interconnect electrically interconnecting the second microelectronic assembly to the transmission line and to the second platform;
wherein the first platform and the second platform are electrically interconnected to the third microelectronic assembly.

13. The electronic system of claim 12, wherein high performance signals from the first and the second microelectronic assemblies are electrically interconnected to the transmission line and lower performance signals from the first and the second microelectronic assemblies are electrically interconnected to the third microelectronic assembly.

14. The electronic system of claim 12, wherein the separable interconnect comprises an anisotropically conductive elastomer.

15. The electronic system of claim 14, wherein the anisotropically conductive elastomer comprises a plurality of electrically conductive elements embedded in an electrically nonconductive polymer, wherein each of the plurality of electrically conductive elements comprises a chain of electrically conductive particles.

16. The electronic system of claim 12, wherein electrical interconnections formed by the separable interconnect exhibit an inductance equal to or less than about 1 nH.

17. The electronic system of claim 12, wherein electrical interconnections formed by the separable interconnect material exhibit a 3 dB fifth harmonic at greater than about 12 GHz.

18. An electronic interconnect assembly comprising:
a first microelectronic assembly;
a network interface comprising a transmission line electrically interconnected to a platform;
a separable interconnect electrically interconnecting the first microelectronic assembly to the platform and to the transmission line; and
a second microelectronic assembly electrically interconnected to the network interface and to the first microelectronic assembly;
wherein high performance signals from the first microelectronic assembly are electrically interconnected to the transmission line and lower performance signals from the first microelectronic assembly are electrically interconnected to the second microelectronic assembly.

19. The electronic interconnect assembly of claim 18, wherein the separable interconnect comprises an anisotropically conductive elastomer comprising a plurality of electrically conductive elements embedded in an electrically nonconductive polymer, wherein each of the plurality of electrically conductive elements comprises a chain of electrically conductive particles.

* * * * *